United States Patent
Takeda (10) Patent No.: US 7,145,599 B2
(45) Date of Patent: Dec. 5, 2006

(54) IMAGE PICKUP APPARATUS AND IMAGE PICKUP METHOD USING PLURAL PHOTOELECTRIC CONVERSION SECTIONS PER PIXEL

(75) Inventor: Nobuhiro Takeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 731 days.

(21) Appl. No.: 10/405,249

(22) Filed: Apr. 3, 2003

(65) Prior Publication Data

US 2003/0193011 A1 Oct. 16, 2003

(30) Foreign Application Priority Data

Apr. 10, 2002 (JP) ............................. 2002-108232

(51) Int. Cl.
*H04N 9/64* (2006.01)
*H04N 5/335* (2006.01)

(52) U.S. Cl. ...................... 348/247; 348/243; 348/275; 348/280

(58) Field of Classification Search ................ 348/241, 348/243, 246, 247, 273, 275, 280
See application file for complete search history.

(56) References Cited

U.S. PATENT DOCUMENTS

| | | | |
|---|---|---|---|
| 5,063,447 A | 11/1991 | Takeda | 358/145 |
| 5,965,875 A | 10/1999 | Merrill | 250/226 |
| 6,452,633 B1* | 9/2002 | Merrill et al. | 348/302 |
| 6,731,397 B1* | 5/2004 | Merrill et al. | 358/1.16 |
| 6,741,283 B1* | 5/2004 | Merrill et al. | 348/308 |
| 6,934,050 B1* | 8/2005 | Merrill et al. | 358/1.16 |
| 2002/0171881 A1* | 11/2002 | Merrill et al. | 358/513 |
| 2003/0193586 A1* | 10/2003 | Hayakawa | 348/272 |
| 2003/0193590 A1* | 10/2003 | Hirai | 348/294 |
| 2004/0080638 A1* | 4/2004 | Lee | 348/272 |
| 2004/0125222 A1* | 7/2004 | Bradski et al. | 348/272 |

* cited by examiner

*Primary Examiner*—Ngoc-Yen Vu
*Assistant Examiner*—Nicholas G Giles
(74) *Attorney, Agent, or Firm*—Fitzpatrick, Cella, Harper & Scinto (57) ABSTRACT

In an image pickup apparatus and image pickup method, an image pickup area where a plurality of pixels each having at least first and second photoelectric conversion sections are arranged in a depth direction is used to pick up an object image, signals from the first and second photoelectric conversion sections are obtained in case that the image pickup area is light-shielded, and differential processing between a signal obtained in the first photoelectric conversion section in case that the image pickup area is light-shielded and a signal obtained in the first photoelectric conversion section by picking up an object image in the image pickup area, and differential processing between a signal obtained in the second photoelectric conversion section in case that the image pickup area is light-shielded and a signal obtained in the second photoelectric conversion section by picking up an object image in the image pickup area are performed, so that correction of image pickup signals is performed.

1 Claim, 6 Drawing Sheets

PRIOR ART

FIG. 8

IMAGE PICKUP APPARATUS AND IMAGE PICKUP METHOD USING PLURAL PHOTOELECTRIC CONVERSION SECTIONS PER PIXEL

BACKGROUND OF THE INVENTION

1. Field of the Invention

The present invention relates to an image pickup apparatus and image pickup method for picking up an object using a solid-state image pickup element.

2. Related Background Art

There is an image pickup apparatus such as a digital camera for electronically or magnetically recording and reproducing on various mediums still images or moving images picked up by a solid-state image pickup element such as a CCD or MOS sensor.

In order to reduce price or improve performance of such an image pickup apparatus, there is an image pickup element (refer to FIG. 8) as described in U.S. Pat. No. 5,965,875 where it is noted that a light absorption coefficient of a semiconductor substrate used in an image pickup element is different according to a light wavelength.

In this patent, there are described a principle of an image pickup element having a three-layer photodiode structure where photodiodes are formed with a triple-well structure, and a pixel circuit. According to the patent, the photodiodes are sequentially diffused from a surface of a p-type silicon substrate, and an n-type layer, a p-type layer, and an n-type layer are deeply formed in this order, so that pn-junction diodes are formed over three layers in the depth direction of the silicon in the same pixel. As a light incident into the diode from the surface has a longer wavelength, it penetrates more deeply. Since the incident light wavelength and the light absorption coefficient indicate a value specific to the silicon, a current is separately detected from the three-layer diodes, so that an optical signal having a different wavelength band can be detected.

The depth of the pn-junction of the three-layer diode is designed so as to cover the wavelength band of a visible light. Three signals are calculated so that signals where an object image is color-separated into three colors of R color, G color, and B color can be obtained.

By the use of such an image pickup element, it is possible to eliminate a color filter for performing color separation of the object image or an optical low-pass filter for preventing moiré due to spatial sampling. Further, in the respective colors obtained by color-separating the object image, centers of gravity of sensitivity match with each other, so that color moiré is advantageously difficult to be produced.

However, in the image pickup element for performing color separation in the depth direction of a semiconductor, when a noise is present, whose occurrence position is unstable in the depth direction of the semiconductor like a dark current, a different noise occurs for each color even in the same pixel, thereby deteriorating the image.

Further, in the image pickup element as described above, among the three photodiodes corresponding to the respective colors in the same pixel, two photodiodes adjacent in the vertical direction are capacitive-coupled to each other via the pn-junction. Further, as charges generated in photoelectric conversion are accumulated in the photodiode, the capacity of the photodiode changes. Therefore, a potential of a photodiode in one layer is influenced even by the amount of charges accumulated in other photodiodes. Further, when the photodiode in the uppermost layer is saturated, the excess charges in this diode are flowed into the n-type area of the photodiode in the lowermost layer beyond a potential barrier made of a second p-type layer from the top. Therefore, when there is a white defect or the like due to a local crystal defect of a semiconductor, even a color signal at the depth where there is no defect is influenced, thereby deteriorating the image.

SUMMARY OF THE INVENTION

The present invention is directed for solving the above problems, and it is therefore an object to provide an image pickup apparatus and image pickup method capable of obtaining a good object image even when a noise such as a dark current different for each color occurs.

As one aspect of the present invention for achieving the above object, the following structure is provided.

There is provided an image pickup apparatus comprising an image pickup area where a plurality of pixels each having at least first and second photoelectric conversion sections are arranged in a depth direction, and a first correction section for performing differential processing between a signal obtained in the first photoelectric conversion section in case that the image pickup area is light-shielded, and a signal obtained in the first photoelectric conversion section by picking up an object image in the image pickup area, and differential processing between a signal obtained in the second photoelectric conversion section in case that the image pickup area is light-shielded and a signal obtained in the second photoelectric conversion section by picking up an object image in the image pickup area.

It is another object of the present invention to provide an image pickup apparatus and image pickup method capable of obtaining a good object image even when there is a pixel defect which also influences a color signal at the depth where there is no defect.

As one aspect of the present invention for achieving the above object, the following structure is provided.

There is provided an image pickup apparatus comprising an image pickup area where a plurality of pixels each having a plurality of photoelectric conversion sections are arranged in a depth direction, and a second correction unit for correcting each of signals from the plurality of photoelectric conversion sections arranged in the depth direction in the same pixel to correct a defective pixel.

It is still another object of the present invention to provide an image pickup apparatus and image pickup method capable of obtaining a good object image without holding data for defect correction in advance even when there is a pixel defect which also influences a color signal at the depth where there is no defect.

As one aspect of the present invention for achieving the above object, the following structure is provided.

There is provided an image pickup apparatus comprising an image pickup area where a plurality of pixels each having at least first and second photoelectric conversion sections are arranged in a depth direction, a first correction unit for performing differential processing between a signal obtained in the first photoelectric conversion section in case that the image pickup area is light-shielded and a signal obtained in the first photoelectric conversion section by picking up an object image in the image pickup area, and differential processing between a signal obtained in the second photoelectric conversion section in case that the image pickup area is light-shielded and a signal obtained in the second photoelectric conversion section by picking up an object image in the image pickup area, a second correction unit provided in the rear stage of the first correction unit for correcting each of signals from the first and second photoelectric conversion sections arranged in the depth direction in the same pixel to correct a defective pixel, and a detection unit for detecting a defective pixel in the image pickup area, wherein, when it is detected that a signal from one photoelectric conversion section in the same pixel requires correction, the detection unit controls the second correction unit so that signals from other photoelectric conversion sections in the same pixel are also corrected, and detects a defective pixel on the basis of a signal before being input into the first correction unit.

The aforementioned objects of the present invention will be apparent from the following drawings and detailed description on the basis of the drawings.

DETAILED DESCRIPTION OF THE PREFERRED EMBODIMENTS

Hereinafter, embodiments according to the present invention will be described referring to the drawings.

First embodiment

Figure 1:
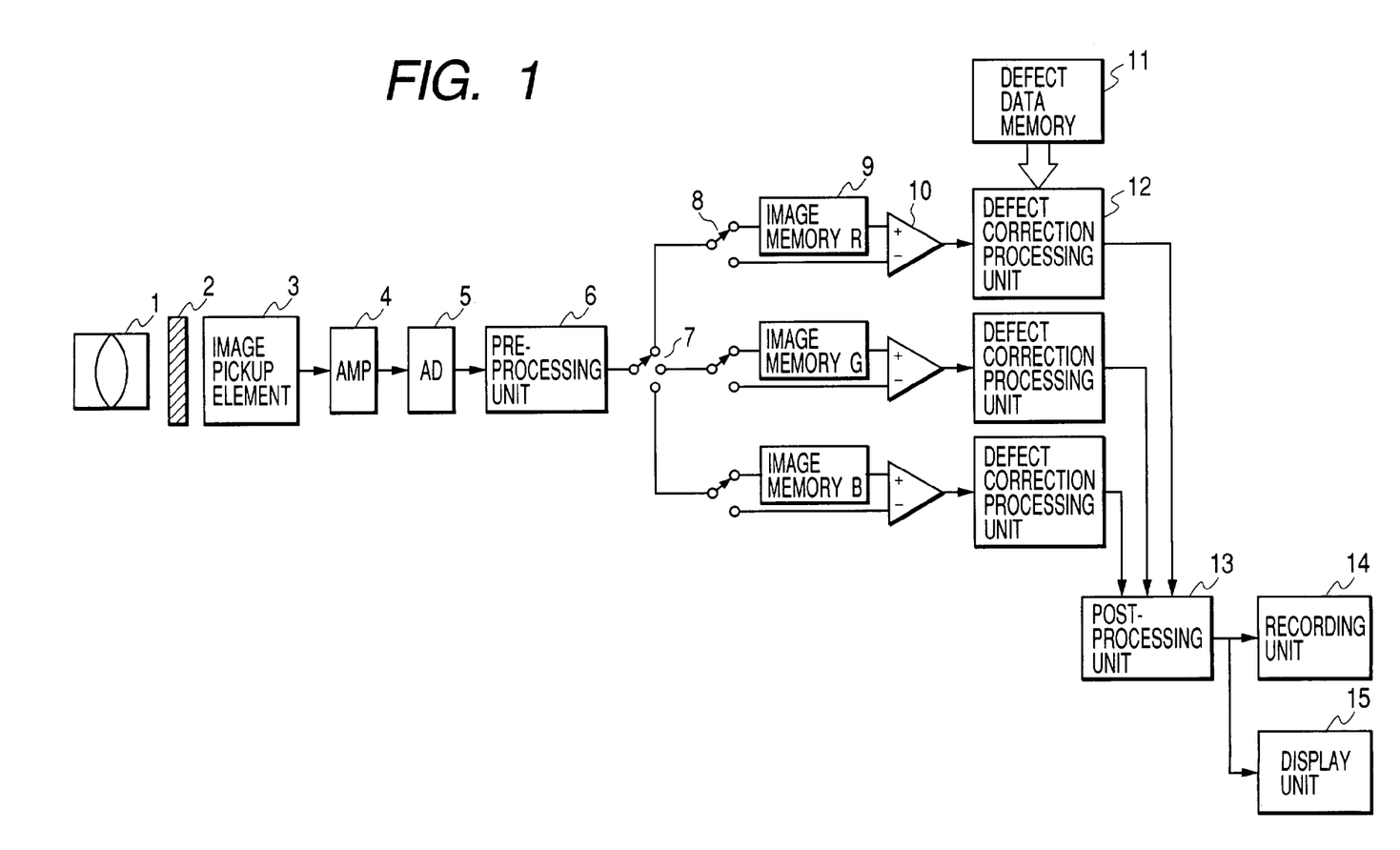
FIG. 1 is a configuration diagram showing an image pickup apparatus according to a first embodiment of the present invention.

FIG. 1 shows a configuration of an image pickup apparatus (digital camera) according to a first embodiment of the present invention.

In FIG. 1, numeral 1 denotes an image pickup optical system, numeral 2 denotes a shutter, numeral 3 denotes an image pickup element, numeral 4 denotes an amplifying circuit, numeral 5 denotes an A/D converter, numeral 6 denotes a signal pre-processing unit, numeral 7 denotes a color separation switch, numeral 8 denotes a changeover switch, numeral 9 denotes an image memory, numeral 10 denotes a subtractor, numeral 11 denotes a defect data memory, numeral 12 denotes a defect correction processing unit, numeral 13 denotes a signal post-processing unit, numeral 14 denotes a recording unit, and numeral 15 denotes a display unit.

Figure 2:
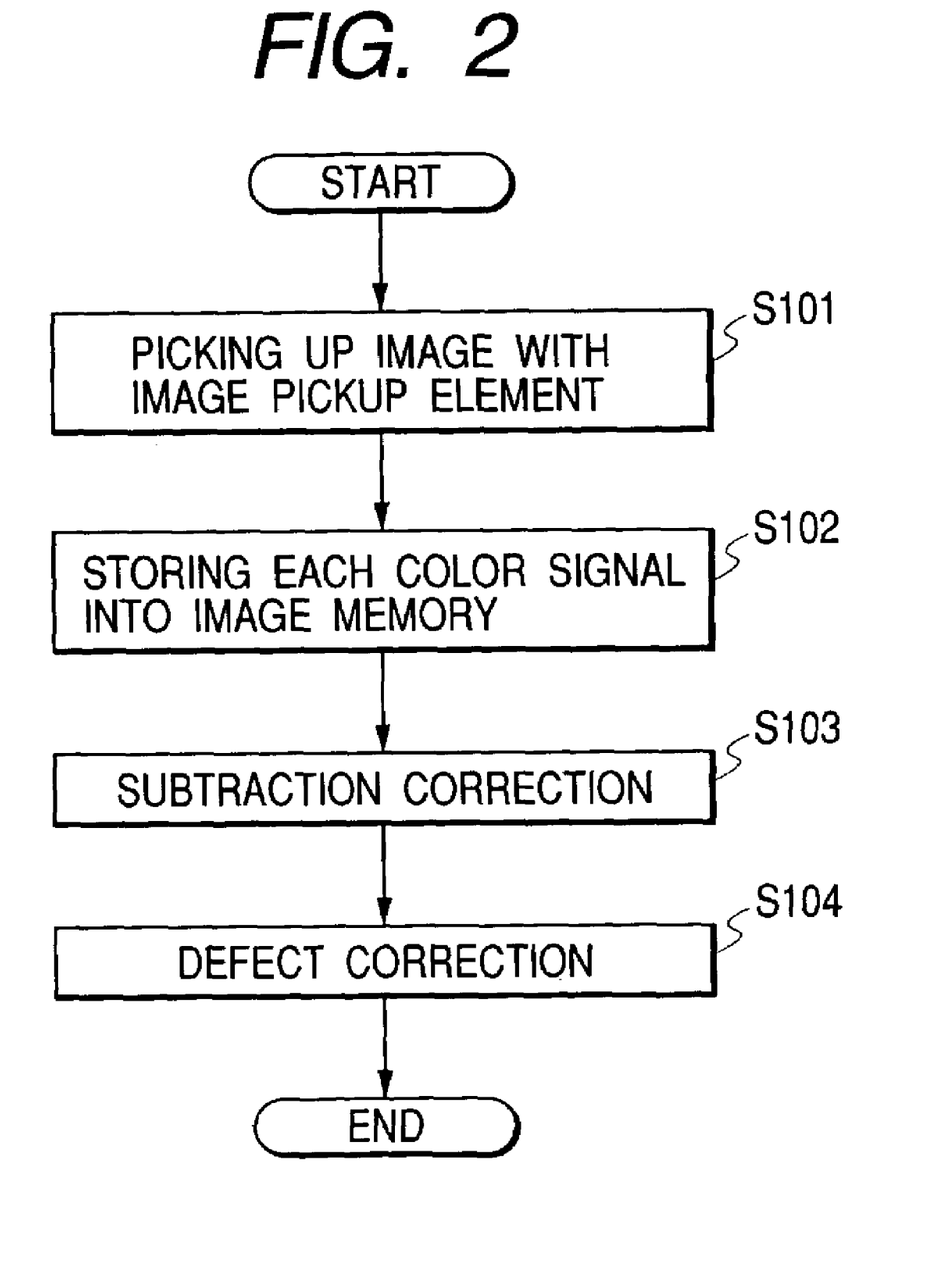
FIG. 2 is a flow chart for explaining correction processing in the first embodiment.

Correction processing according to the first embodiment of the present invention will be described using FIG. 1 and a flow chart of FIG. 2.

Figure 8:
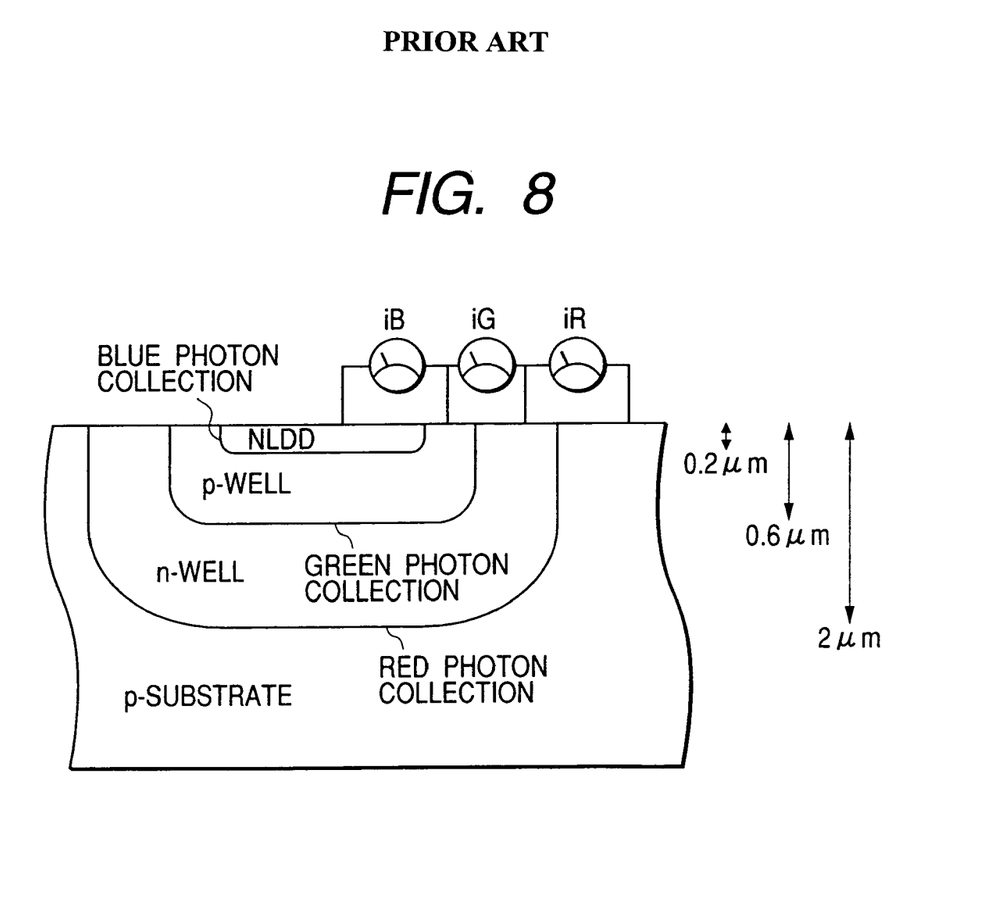
FIG. 8 is a diagram for explaining a pixel having photodiodes in the depth direction of a semiconductor.

The image pickup element 3 is an image pickup element having an image pickup area in which a plurality of pixels each having photodiodes which are a plurality of photoelectric conversion sections are arranged in the depth direction of a semiconductor as shown in FIG. 8. Defect data (position of defective pixel) of the image pickup element 3 detected in advance is stored in the defect data memory 11. This defect data is obtained by detecting a position of a pixel which exceeds a certain threshold value, from an image picked up, for example, in the light-shielded state.

In the present embodiment, at first, an object is picked up (S101). The object image formed by the image pickup optical system 1 is converted into an electric signal by the image pickup element 3 via the shutter 2 controlled and driven so as to have the appropriate amount of exposure. The object image is amplified or level-shifted so as to be appropriate for an input range of the A/D converter 5 in the amplifying circuit 4. An analog signal is digitized in the A/D converter 5. A black level adjustment such as clamp is performed on the digitized image data by the signal pre-processing unit 6. At this time, three changeover switches 8 are connected to the image memories 9, respectively.

The color separation switch 7 is driven so as to store the image signals output from the image pickup element 3 into the image memories corresponding to the respective colors. In other words, a signal from a photodiode at the deepest position in the depth direction is stored in the image memory R, a signal from a photodiode at the second deepest position in the depth direction is stored in the image memory G, and a signal from a photodiode at the shallowest position in the depth direction is stored in the image memory B. Thereby, the image data of the color-separated object image is stored in the image memories 9 (S102).

Thereafter, correction processing using the subtractors 10 is performed (S103). Here, at first, image pickup of the same accumulation time as that of image pickup of the object is performed under a condition that the shutter 2 is closed, that is, the image pickup element 3 is light-shielded. At this time, the three changeover switches 8 are connected to the direction opposite to the image memories 9, that is, the subtractors 10. Further, the image memories 9 output the image data of the object image at the same position as that of the light-shielded image data to the subtractors 10. Thereby, the image data of the object image whose unevenness or slight defect resulting from a dark current of the image pickup element has been corrected is output from the subtractors 10. Further, the correction is independently performed for each color separated in the image pickup element 3. In other words, a dark current signal from the photodiode at the deepest position in the depth direction is subjected to differential processing relative to the signal stored in the image memory R, a dark current signal from the photodiode at the second deepest position in the depth direction is subjected to differential processing relative to the signal stored in the image memory G, and a dark current signal from the photodiode at the shallowest position in the depth direction is subjected to differential processing relative to the signal stored in the image memory B.

As described above, the image pickup apparatus according to the present embodiment has said image pickup area (image pickup element 3) where a plurality of pixels each having at least first, second, and third photoelectric conversion sections (corresponding to BLUE PHOTON COLLECTION, GREEN PHOTON COLLECTION, and RED PHOTON COLLECTION, respectively, in FIG. 8) are arranged in the depth direction of a semiconductor, and a first correction unit consisting of the image memories 9 and the subtractors 10 for performing differential processing between a signal obtained in the first photoelectric conversion section in case that said image pickup area is light-shielded and a signal obtained in the first photoelectric conversion section by picking up an object image in said image pickup area, differential processing between a signal obtained in the second photoelectric conversion section in case that said image pickup area is light-shielded and a signal obtained in the second photoelectric conversion section by picking up an object image in said image pickup area, and differential processing between a signal obtained in the third photoelectric conversion section in case that said image pickup area is light-shielded and a signal obtained in the third photoelectric conversion section by picking up an object image in said image pickup area, so that correction can be performed even when different noises are present for the respective colors.

In the defect correction processing unit 12, defect correction processing is performed on the basis of the defect data stored in the defect data memory 11 in advance (S104). The defect-corrected image data is subjected to color processing and the like in the signal post-processing unit 13, and then transmitted to the recording unit 14 or the display unit 15 so as to be recorded or displayed therein.

Figure 3:
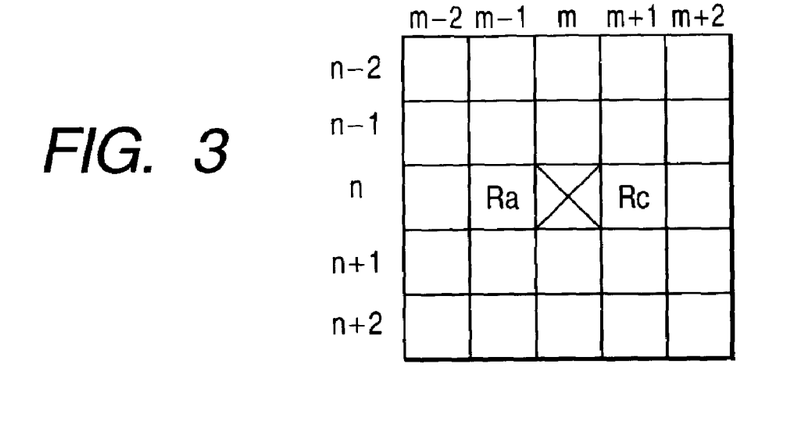
FIG. 3 is a diagram for explaining defect correction of R color.

The defect correction processing in step S104 will be described with reference to FIGS. 3, 4, and 5. FIG. 3 shows a vicinity of m-th column and n-th row of the R color of the image signal of the object image color-separated and stored in the image memory. In this example, the R color pixel at m-th column and n-th row is detected as a defect in advance and stored in the defect data memory 11. In the defect correction processing unit 12, position information of the defect is read by the defect data memory 11, and the image data of the defect position is replaced and interpolated by the image data of the same color as the neighboring pixels. In the case of FIG. 3, since the R color pixel at m-th column and n-th row is defective, for example, the image data Ra of the R color pixel at m−1-th column and n-th row and the image data Rc of the R color pixel at m+1-th column and n-th row are used, so that the average value therebetween is assumed as the image data of the R color pixel at m-th column and n-th row.

Figure 4:
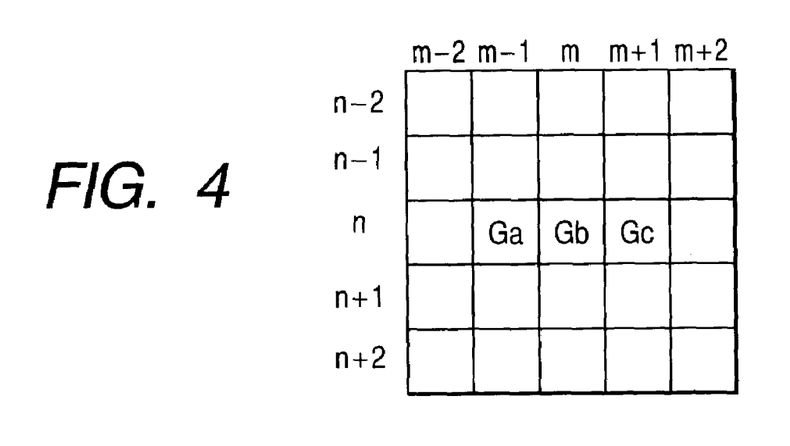
FIG. 4 is a diagram for explaining defect correction of G color.
Figure 5:
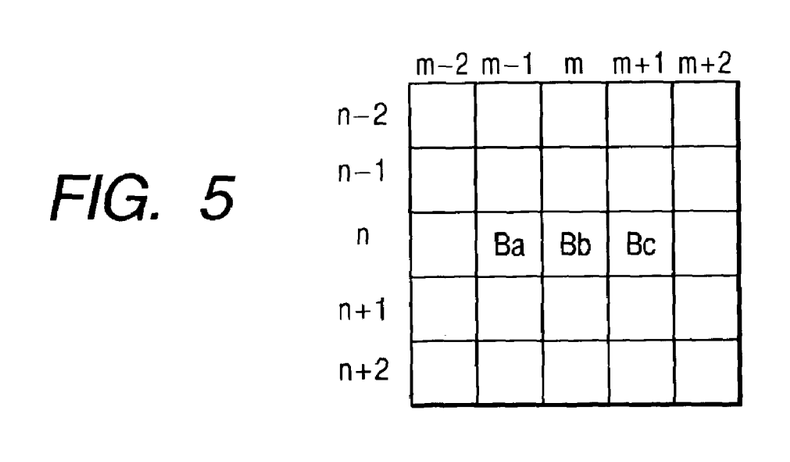
FIG. 5 is a diagram for explaining defect correction of B color.

FIGS. 4 and 5 show vicinities of m-th column and n-th row of the image signals of the object image of the G color and the B color, respectively. The pixels Gb and Bb at m-th column and n-th row in FIGS. 4 and 5 have not been detected as defects in advance. However, in the present invention, when other colors in the same pixel are defective as in FIG. 3, defect correction is similarly performed on the image data of all the colors. Therefore, the image data Gb of the G color is replaced with the average value between Ga and Gc. Similarly, the image data Bb of the B color is replaced with the average value between Ba and Bc. In this manner, when the image signal of any one of colors of the same pixel has been detected as a defect in advance, similar defect correction processing is performed on the image signals of all the colors, so that image deterioration resulting from influence in terms of the structure on a color signal at the depth where there is no defect can be prevented.

As described above, the image pickup apparatus according to the present embodiment has said image pickup area where a plurality of pixels each having a plurality of photoelectric conversion sections are arranged in the depth direction of a semiconductor, and a second correction unit consisting of the defect data memory 11 and the defect correction processing unit 12 for correcting each of signals from the plurality of photoelectric conversion sections in the depth direction in the same pixel to correct defective pixel, so that defect correction can be accurately performed.

In the embodiment described above, the front stage of the image memory 9 is configured so that signals are transmitted with time-series, but the amplifying circuit 4, the A/D converter 5, and the signal pre-processing unit 6 may be provided in parallel so that the signals are output from the image pickup element to the image memory R, the image memory G, and the image memory B in parallel. In this case, the signals from the three photoelectric conversion sections of the same pixel arranged in the depth direction of a semiconductor are read from the image pickup element in parallel.

Second embodiment

Figure 6:
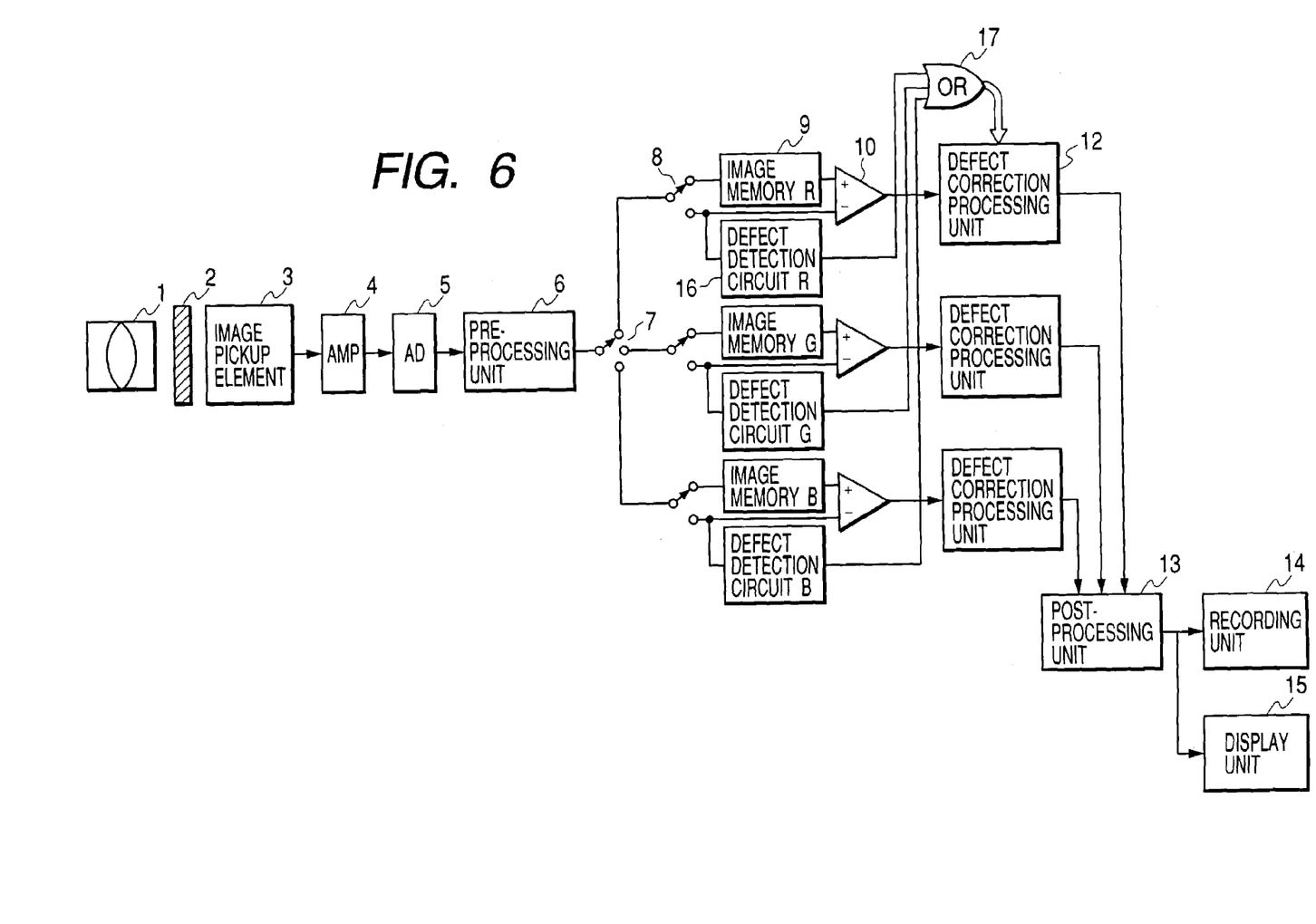
FIG. 6 is a configuration diagram showing an image pickup apparatus according to a second embodiment of the present invention.

FIG. 6 shows a configuration of an image pickup apparatus according to a second embodiment of the present invention. In FIG. 6, same components as those in FIG. 1 are denoted with the same reference numerals, and description thereof will be omitted. Numeral 16 denotes a defect detection circuit, and numeral 17 denotes a defect data mixing circuit.

Figure 7:
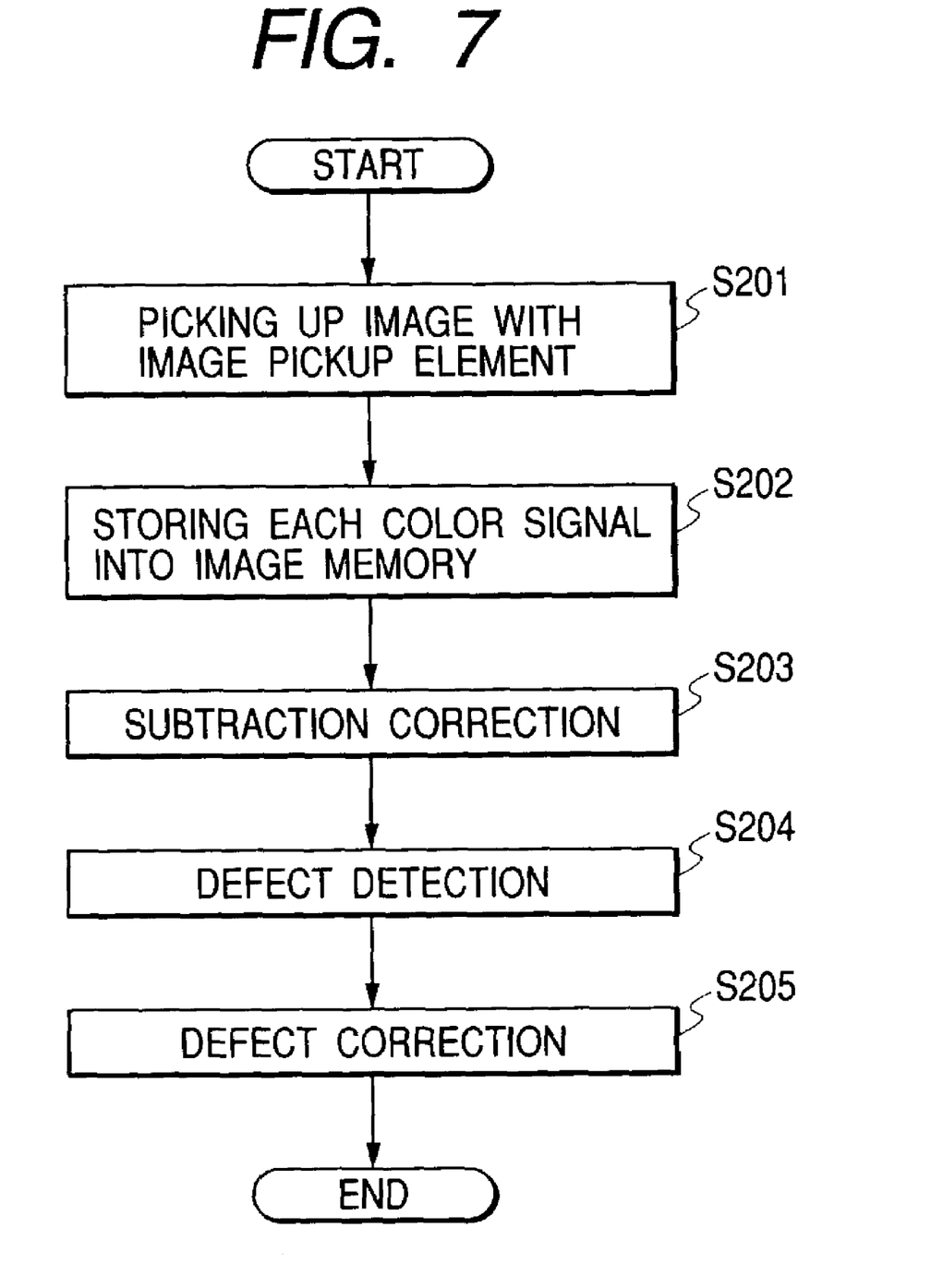
FIG. 7 is a flow chart for explaining correction processing in the second embodiment.

Correction processing according to the second embodiment of the present invention will be described with reference to FIG. 6 and a flow chart of FIG. 7.

The image pickup element 3 is an image pickup element having a three-layer photodiode structure described as a conventional example. The defect detection circuit 16 detects a defect resulting from a dark current, from image data picked up in case that the shutter 2 is closed, that is, the image pickup element 3 is light-shielded. The method therefor is to determine as a defect a pixel whose ratio or difference between the image data value of a detection target pixel and the average value of the image data of the neighboring pixels is not less than a predetermined value, and to output a result as defect data.

Even when any one of colors of the same pixel is defective, the defect data detected for each color is combined into the data of defect pixel position, by the defect data mixing circuit 17.

In the present embodiment, at first, an object is picked up (S201). The object image formed in the image pickup optical system 1 is converted into an electric signal in the image pickup element 3 via the shutter 2 controlled and driven so as to have the appropriate amount of exposure. The object image is amplified or level-shifted so as to be appropriate for an input range of the A/D converter 5 in the amplifying circuit 4. An analog signal is digitized in the A/D converter 5. A black level adjustment such as clamp is performed for the digitized image data in the signal pre-processing unit 6. At this time, the three changeover switches 8 are connected to the image memories 9, respectively.

The color separation switch 7 is driven so as to store the image signals output from the image pickup element 3 into the image memories corresponding to the respective colors. Thereby, the image data of the color-separated object image is stored in the image memories 9 (S202).

Thereafter, correction processing using the subtractors 10 is performed (S203). Here, at first, image pickup of the same accumulation time as that of image pickup of the object is performed under a condition that the shutter 2 is closed, that is, the image pickup element 3 is light-shielded. At this time, the three changeover switches 8 are connected to the direction opposite to the image memories 9, that is, the subtractors 10. At the same time, the light-shielded imaged data is input into the defect detection circuits 16 for each color.

The defect detection circuit 16 performs the aforementioned defect detection to output the defect data for each color (S204). Further, the image memories 9 output to the subtractors 10 the image data of the object image at the same position as that of the light-shielded image data. Thereby, the image data of the object image whose unevenness or slight defect resulting from a dark current of the image pickup element has been corrected is output from the subtractors 10. Further, the correction is independently performed for each color separated in the image pickup element 3, so that correction can be performed even when different noises are present for the respective colors.

The defect correction processing unit 12 performs defect correction processing on the basis of the defect data after the defect data output from the three defect detection circuits 16 is combined in the defect data mixing circuit 17 (S205). The defect-corrected image data is subjected to color processing and the like in the signal post-processing unit 13, and then transmitted to the recording unit 14 or the display unit 15 so as to be recorded or displayed therein. Since, after the defect data of all the colors is combined in the defect data mixing circuit 17, correction is performed by the defect correction processing units 12, image deterioration resulting from influence in terms of the structure on a color signal at the depth where there is no defect can be prevented. Furthermore, defect correction can be performed without preparing the defect data in advance.

As described above, the image pickup apparatus according to the present embodiment has said image pickup area where a plurality of pixels each having a plurality of photoelectric conversion sections are arranged in the depth direction of a semiconductor, and a second correction unit consisting of the defect detection circuits 16, the defect data mixing circuit 17, and the defect correction processing units 12 for performing correction of each signal from the plurality of photoelectric conversion sections in the depth direction in the same pixel to correct a defective pixel, so that defect correction can be accurately performed.

In the aforementioned embodiment, the front stage of the image memory 9 is configured so that signals are transmitted with time-series, but the amplifying circuit 4, the A/D converter 5, and the signal pre-processing unit 6 may be provided in parallel so that the signals are output from the image pickup element to the image memory R, the image memory G, and the image memory B in parallel. In this case, the signals from the three photoelectric conversion sections of the same pixel, arranged in the depth direction of a semiconductor are read from the image pickup element in parallel. Furthermore, the defect data detection is performed after the object image pickup, but may be performed, for example, after the image pickup apparatus is turned on, alternatively, before or after the object is picked up, or when there is time for control of the image pickup apparatus.

In addition, in the first and second embodiments described above, the number of colors of the image pickup element to be separated in the depth direction of a semiconductor is three of R, G, and B, but may be two or more. In other words, the image pickup element is configured to have at least first and second photoelectric conversion sections arranged in the depth direction of a semiconductor.

Further, in the above first and second embodiments, there is shown the circuit having both a circuit for correcting a dark current (first correction unit) and a circuit for correcting a defective pixel (second correction unit), but the circuit may be configured to have either one circuit.

Other embodiments

In the above embodiments, there is described an example where the present invention is applied to a digital camera, but the present invention is not limited thereto, and can be applied to other apparatuses such as digital video camera, as long as the image pickup element used in the above embodiments is available.

Further, in the above embodiments, the first correction unit and the second correction unit for performing processings according to the present invention are configured with circuits, but the present invention is not limited thereto, and all or part of these units may be configured on the memory by software.

In other words, it goes without saying that the objects of the present invention can be accomplished by supplying a storage medium storing a program code of a software for realizing the functions of the above embodiments therein to a system or an apparatus so that a computer (or CPU or MPU) in the system or the apparatus reads the program code stored in the storage medium.

In this case, the program code itself read from the storage medium realizes the functions of the above embodiments, so that the storage medium storing the program code therein configures the present invention.

As a storage medium for supplying a program code, there may be employed, for example, a flexible disk, a hard disk, an optical disk, a magneto optical disk, a CD-ROM, a CD-R, a magnetic tape, a nonvolatile memory card, a ROM, and the like.

Further, it goes without saying not only that the program code read by the computer is executed so that the functions of the above embodiments can be realized but also that an OS (operating system) running on the computer performs part of or all the actual processings, so that the functions of the above embodiments can be realized.

Furthermore, it goes without saying that, after the program code read from the storage medium is written into a memory provided in a function extension board inserted into the computer or a function extension unit connected to the computer, the CPU or the like provided in the function extension board or the function extension unit performs part of or all the actual processings on the basis of an instruction of the program code, so that the functions of the above embodiments can be realized.

Hereinbefore, the present invention is described by the preferred embodiments, but the present invention is not limited to the above embodiments, and can be variously modified within the range described in the claims.

What is claimed is:

1. An image pickup apparatus comprising:
   an image pickup area where a plurality of pixels each having at least first and second photoelectric conversion sections are arranged in a depth direction;
   a first correction unit which performs differential processing between a signal obtained in the first photoelectric conversion section in case that said image pickup area is light-sheilded and a signal obtained in the first photoelectric conversion section by picking up an object image in said image pickup area, and differential processing between a signal obtained in the second photoelectric conversion section in case that said image pickup area is light-shielded and a signal obtained in the second photoelectric conversion section by picking up an object image in said image pickup area;
   a second correction unit provided in the rear stage of the first correction unit, which performs correction of each of signals from the first and second photoelectric conversion sections arranged in the depth direction in the same pixel to correct a defective pixel; and
   a detection wilt which detects a defective pixel in said image pickup area,
   wherein, when it is detected that a signal from one photoelectric conversion section in the same pixel requires correction, said detection unit controls said second correction unit so that signals from the other photoelectric conversion sections in the same pixel are also corrected, and detects a defective pixel on the basis of a signal before being input into said first correction unit.

* * * * *

UNITED STATES PATENT AND TRADEMARK OFFICE
CERTIFICATE OF CORRECTION

PATENT NO. : 7,145,599 B2  
APPLICATION NO. : 10/405249  
DATED : December 5, 2006  
INVENTOR(S) : Takeda

Page 1 of 1

It is certified that error appears in the above-identified patent and that said Letters Patent is hereby corrected as shown below:

COLUMN 8:
Line 37, "light-sheilded" should read --light-shielded--.
Line 50, "wilt" should read --unit--.

Signed and Sealed this

First Day of July, 2008

JON W. DUDAS
*Director of the United States Patent and Trademark Office*